United States Patent
Miyake

(10) Patent No.: US 9,466,618 B2
(45) Date of Patent: Oct. 11, 2016

(54) SEMICONDUCTOR DEVICE INCLUDING TWO THIN FILM TRANSISTORS AND METHOD OF MANUFACTURING THE SAME

(75) Inventor: Hiroyuki Miyake, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 14 days.

(21) Appl. No.: 13/468,580

(22) Filed: May 10, 2012

(65) Prior Publication Data

US 2012/0286263 A1 Nov. 15, 2012

(30) Foreign Application Priority Data

May 13, 2011 (JP) ................................ 2011-108844

(51) Int. Cl.
*H01L 27/12* (2006.01)
*H01L 29/786* (2006.01)
*H01L 29/417* (2006.01)
*H01L 27/11* (2006.01)

(52) U.S. Cl.
CPC ..... *H01L 27/1225* (2013.01); *H01L 29/41733* (2013.01); *H01L 29/7869* (2013.01); *H01L 29/78624* (2013.01); *H01L 27/1108* (2013.01); *H01L 27/1214* (2013.01)

(58) Field of Classification Search
CPC ....................... H01L 27/1108; H01L 29/78624
See application file for complete search history.

(56) References Cited

U.S. PATENT DOCUMENTS

| | | |
|---|---|---|
| 5,731,856 A | 3/1998 | Kim et al. |
| 5,744,823 A * | 4/1998 | Harkin et al. .................. 257/68 |
| 5,744,864 A | 4/1998 | Cillessen et al. |
| 6,121,660 A * | 9/2000 | Yamazaki et al. ............ 257/348 |
| 6,218,219 B1 | 4/2001 | Yamazaki et al. |
| 6,294,274 B1 | 9/2001 | Kawazoe et al. |
| 6,407,431 B2 | 6/2002 | Yamazaki et al. |
| 6,563,174 B2 | 5/2003 | Kawasaki et al. |
| 6,573,564 B2 | 6/2003 | Yamazaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates, D. et al., "Optical Studies of the Amorphous Liquid-Cholesteric Liquid Crystal Transition:The Blue Phase," Physics Letters, Sep. 10, 1973, vol. 45A, No. 2, pp. 115-116.

(Continued)

*Primary Examiner* — Tucker J Wright
*Assistant Examiner* — Mark Hatzilambrou
(74) *Attorney, Agent, or Firm* — Husch Blackwell LLP

(57) ABSTRACT

It is an object to form a buffer circuit, an inverter circuit, or the like using only n-channel TFTs including an oxide semiconductor layer. A buffer circuit, an inverter circuit, or the like is formed by combination of a first transistor in which a source electrode and a drain electrode each overlap with a gate electrode and a second transistor in which a source electrode overlaps with a gate electrode and a drain electrode does not overlap with the gate electrode. Since the second transistor has such a structure, the capacitance $C_p$ can be small, and $V_A{'}$ can be large even in the case where the potential difference VDD−VSS is small.

11 Claims, 11 Drawing Sheets

(56) References Cited

U.S. PATENT DOCUMENTS

| | | | |
|---|---|---|---|
| 6,727,522 B1 | 4/2004 | Kawasaki et al. |
| 6,756,816 B2 | 6/2004 | Miyake |
| 6,788,108 B2 | 9/2004 | Miyake et al. |
| 6,813,332 B2 | 11/2004 | Nagao et al. |
| 6,928,136 B2 | 8/2005 | Nagao et al. |
| 6,975,142 B2 | 12/2005 | Azami et al. |
| 7,049,190 B2 | 5/2006 | Takeda et al. |
| 7,057,598 B2 | 6/2006 | Azami et al. |
| 7,061,014 B2 | 6/2006 | Hosono et al. |
| 7,064,346 B2 | 6/2006 | Kawasaki et al. |
| 7,068,076 B2 | 6/2006 | Azami |
| 7,105,868 B2 | 9/2006 | Nause et al. |
| 7,202,863 B2 | 4/2007 | Kimura et al. |
| 7,205,610 B2 | 4/2007 | Koyama |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,432,737 B2 | 10/2008 | Yoshida |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,633,471 B2 | 12/2009 | Yamazaki et al. |
| 7,674,650 B2 | 3/2010 | Akimoto et al. |
| 7,687,808 B2 | 3/2010 | Umezaki |
| 7,732,819 B2 | 6/2010 | Akimoto et al. |
| 7,932,888 B2 | 4/2011 | Miyake |
| 7,978,274 B2 | 7/2011 | Umezaki et al. |
| 8,003,449 B2 | 8/2011 | Akimoto et al. |
| 8,054,279 B2 | 11/2011 | Umezaki et al. |
| 8,399,313 B2 | 3/2013 | Akimoto et al. |
| 8,461,582 B2 | 6/2013 | Kimura |
| 8,759,206 B2 | 6/2014 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0017681 A1* | 1/2006 | Jang et al. ............... 345/98 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278120 A1 | 11/2009 | Lee et al. |
| 2009/0278122 A1 | 11/2009 | Hosono et al. |
| 2009/0280600 A1 | 11/2009 | Hosono et al. |
| 2009/0310734 A1 | 12/2009 | Umezaki |
| 2010/0026619 A1 | 2/2010 | Umezaki |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0110623 A1 | 5/2010 | Koyama et al. |
| 2010/0134396 A1 | 6/2010 | Umezaki |
| 2010/0182226 A1 | 7/2010 | Umezaki |
| 2010/0201659 A1 | 8/2010 | Miyake et al. |
| 2010/0224880 A1* | 9/2010 | Kimura .................. 257/59 |
| 2010/0245304 A1 | 9/2010 | Umezaki |
| 2011/0018915 A1 | 1/2011 | Umezaki et al. |
| 2011/0064186 A1 | 3/2011 | Koyama |
| 2011/0073860 A1 | 3/2011 | Kanno et al. |
| 2011/0084264 A1 | 4/2011 | Yamazaki et al. |
| 2011/0084266 A1* | 4/2011 | Yamazaki et al. .............. 257/43 |
| 2011/0140108 A1 | 6/2011 | Kimura et al. |
| 2011/0204928 A1 | 8/2011 | Umezaki et al. |
| 2011/0215787 A1 | 9/2011 | Shionoiri et al. |
| 2011/0216875 A1 | 9/2011 | Miyake |
| 2011/0279438 A1 | 11/2011 | Ito |
| 2011/0285675 A1 | 11/2011 | Amano et al. |
| 2012/0026774 A1 | 2/2012 | Shionoiri |
| 2012/0164766 A1 | 6/2012 | Yeh et al. |
| 2012/0267622 A1 | 10/2012 | Yamazaki et al. |
| 2014/0291676 A1 | 10/2014 | Kimura |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-103066 A | 4/1999 |
| JP | 11-505377 | 5/1999 |
| JP | 11-515143 | 12/1999 |
| JP | 2000-044236 A | 2/2000 |
| JP | 2000-150900 A | 5/2000 |
| JP | 2002-49333 | 2/2002 |

(56) References Cited

FOREIGN PATENT DOCUMENTS

| | | |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-189673 A | 7/2005 |
| JP | 2006-179878 A | 7/2006 |
| JP | 2009-188748 A | 8/2009 |
| JP | 2010-135762 A | 6/2010 |
| JP | 2010-232645 A | 10/2010 |
| JP | 2011-077283 A | 4/2011 |
| WO | WO 97/15948 A2 | 5/1997 |
| WO | WO-2004/114391 | 12/2004 |
| WO | WO 2007/080813 A1 | 7/2007 |
| WO | WO 2010/050419 A1 | 5/2010 |

OTHER PUBLICATIONS

Meiboom, S. et al., "Theory of the Blue Phase of Cholesteric Liquid Crystals," Physical Review Letters, May 4, 1981, vol. 46, No. 18, pp. 1216-1219.

Costello, M. et al., "Electron Microscopy of a Cholesteric Liquid Crystal and Its Blue Phase," Physical Review. A, May 1, 1984, vol. 29, No. 5, pp. 2957-2959.

Kimizuka, N. et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Kitzerow, H. et al., "Observation of Blue Phases in Chiral Networks," Liquid Crystals, 1993, vol. 14, No. 3, pp. 911-916.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Chern, H. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Prins, M. et al., "A Ferroelectric Transparent Thin-Film Transistor," Applied Physics Letters, Jun. 17, 1996, vol. 68, No. 25, pp. 3650-3652.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Kikuchi, H. et al., "Polymer-Stabilized Liquid Crystal Blue Phases," Nature Materials, Sep. 2, 2002, vol. 1, pp. 64-68.

Tsuda, K. et al., "Ultra Low Power Consumption Technologies for Mobile TFT-LCDs," IDW '02: Proceedings of the 9th International Display Workshops, Dec. 4, 2002, pp. 295-298.

Nomura, K. et al., "Thin-Film Transistor Fabricated in Single-Crystalline Transparent Oxide Semiconductor," Science, May 23, 2003, vol. 300, No. 5623, pp. 1269-1272.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Kanno, H. et al., "White Stacked Electrophosphorecent Organic Light-Emitting Devices Employing MoO3 as a Charge-Generation Layer," Advanced Materials, 2006, vol. 18, No. 3, pp. 339-342.

Lee, H. et al., "Current Status of, Challenges to, and Perspective View of AM-OLED," IDW '06: Proceedings of the 13th International Display Workshops, Dec. 7, 2006, pp. 663-666.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hirao, T. et al., "Novel Top-Gate Zinc Oxide Thin-Film Transistors (ZnO TFTs) for AMLCDs," Journal of the SID, 2007, vol. 15, No. 1, pp. 17-22.

Park, S. et al., "Challenge to Future Displays: Transparent AM-OLED Driven by PEALD Grown ZnO TFT," IMID '07 Digest, 2007, pp. 1249-1252.

Kikuch, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Miyasaka, M., 58.2: Invited Paper: "SUFTLA Flexible Microelectronics on Their Way to Business," SID Digest '07: SID International Symposium Digest of Technical Papers, 2007, vol. 38, pp. 1673-1676.

Kurokawa, Y. et al., "UHF RFCPUS on Flexible and Glass Substrates for Secure RFID Systems," Journal of Solid-State Circuits, 2008, vol. 43, No. 1, pp. 292-299.

Jeong, J. et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Lee, J. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Park, J. et al., "Amorphous Indium—Gallium—Zinc Oxide TFTs and Their Application for Large Size AMOLED," AM-FPD '08 Digest of Technical Papers, Jul. 2, 2008, pp. 275-278.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Sakata, J. et al., "Development of 4.0-In. AMOLED Display With Driver Circuit Using Amorphous In—Ga—Zn—Oxide TFTs," IDW '09: Proceedings of the 16th International Display Workshops, 2009, pp. 689-692.

Asaoka, Y. et al., "29.1:Polarizer-Free Reflective LCD Combined With Ultra Low-Power Driving Technology," SID Digest '09: SID International Symposium Digest of Technical Papers, May 31, 2009, pp. 395-398.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Jin, D. et al., "65.2: Distinguished Paper: World-Largest (6.5') Flexible Full Color Top Emission AMOLED Display on Plastic Film and Its Bending Properties," SID Digest '09: SID International Symposium Digest of Technical Papers, May 31, 2009, pp. 983-985.

Lee, M. et al., "15.4:Excellent Performance of Indium-Oxide-Based Thin-Film Transistors by DC Sputtering," SID Digest '09: SID International Symposium Digest of Technical Papers, May 31, 2009, pp. 191-193.

Cho, D. et al., "21.2:Al and Sn-Doped Zinc Indium Oxide Thin Film Transistors for AMOLED Back-Plane," SID Digest '09: SID International Symposium Digest of Technical Papers, May 31, 2009, pp. 280-283.

Kikuchi, H. et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Osada, T. et al., "15.2: Development of Driver-Integrated Panel using Amorphous In—Ga—Zn—Oxide TFT," SID Digest '09: SID International Symposium Digest of Technical Papers, May 31, 2009, pp. 184-187.

(56) References Cited

OTHER PUBLICATIONS

Ohara, H. et al., "21.3:4.0 In. QVGA AMOLED Display Using In—Ga—Zn—Oxide TFTs With a Novel Passivation Layer," SID Digest '09: SID International Symposium Digest of Technical Papers, May 31, 2009, pp. 284-287.

Godo, H. et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Osada, T. et al., "Development of Driver-Integrated Panel Using Amorphous In—Ga—Zn—Oxide TFT," AM-FPD '09 Digest of Technical Papers, Jul. 1, 2009, pp. 33-36.

Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Park, J. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Nakamura, M., "Synthesis of Homologous Compound with New Long-Period Structure," NIRIM Newsletter, Mar. 1, 1995, vol. 150, pp. 1-4.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Orita, M., et al., "Mechanism of Electrical Conductivity of Transparent InGaZnO4," Physical Review. B, Jan. 15, 2000, vol. 61, No. 3, pp. 1811-1816.

Van De Walle, C., "Hydrogen as a Cause of Doping in Zinc Oxide," Physical Review Letters, Jul. 31, 2000, vol. 85, No. 5, pp. 1012-1015.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Janotti, A. et al., "Oxygen Vacancies in ZnO," Applied Physics Letters, 2005, vol. 87, pp. 122102-1-122102-3.

Clark, S. et al., "First Principles Methods Using CASTEP," ZeitSchrift fur Kristallographie, 2005, vol. 220, pp. 567-570.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Janotti, A. et al., "Native Point Defects in ZnO," Physical Review. B, Oct. 4, 2007, vol. 76, No. 16, pp. 165202-1-165202-22.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Park, J. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, J. et al., "Electronic Transport Properties of Amorphous Indium—Gallium—Zinc Oxide Semiconductor Upon Exposure to Water," Applied Physics Letters, 2008, vol. 92, pp. 072104-1-072104-3.

Hsieh, H. et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Oba, F. et al., "Defect Energetics in ZnO: A hybrid Hartree-Fock Density Functional Study," Physical Review. B, 2008, vol. 77, pp. 245202-1-245202-6.

Kim, S. et al., "High-Performance Oxide Thin Film Transistors Passivated by Various Gas Plasmas," 214th ECS Meeting, 2008, No. 2317, ECS.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Son, K. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Fung, T. et al., "2-D Numerical Simulation of High Performance Amorphous In—Ga—Zn—O TFTs for Flat Panel Display,", AM-FPD '08 Digest of Technical Papers, Jul. 2, 2008, pp. 251-252, The Japan Society of Applied Physics.

Mo, Y. et al., "Amorphous Oxide TFT Backplanes for Large Size AMOLED Displays," IDW '08: Proceedings of the 6th International Display Workshops, Dec. 3, 2008, pp. 581-584.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Fortunato, E. et al., "Wide-Bandgap High-Mobility ZnO Thin-Film Transistors Produced at Room Temperature," Applied Physics Letters, Sep. 27, 2004, vol. 85, No. 13, pp. 2541-2543.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Oh, M. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Park, J. et al., "Dry Etching of ZnO Films and Plasma-Induced Damage to Optical Properties," Journal of Vacuum Science & Technology B, Mar. 1, 2003, vol. 21, No. 2, pp. 800-803.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Nomura, K. et al., "Carrier Transport in Transparent Oxide Semiconductor with Intrinsic Structural Randomness Probed Using Single-Crystalline InGaO3(ZnO)5 films," Applied Physics Letters, Sep. 13, 2004, vol. 85, No. 11, pp. 1993-1995.

\* cited by examiner

● In
☾ Sn
☽ Zn
● O

FIG. 11A    FIG. 11B    FIG. 11C
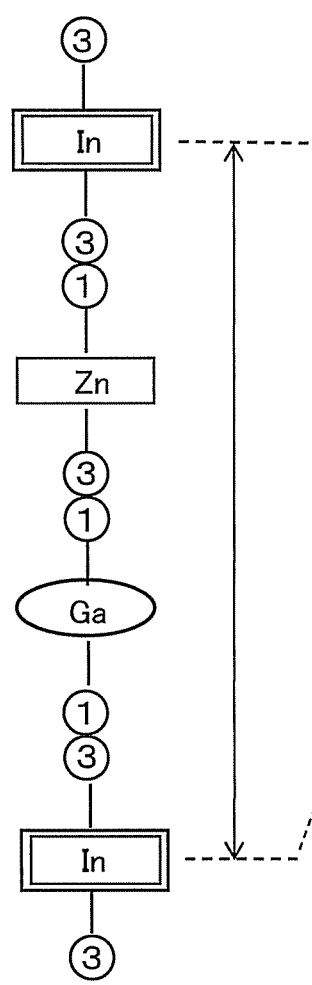
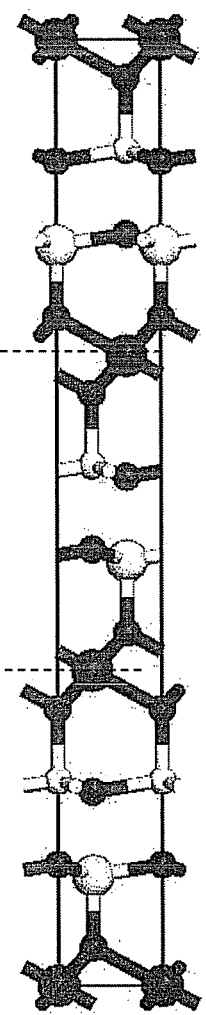
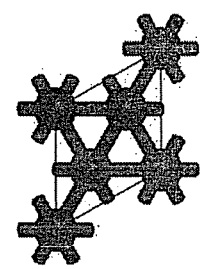
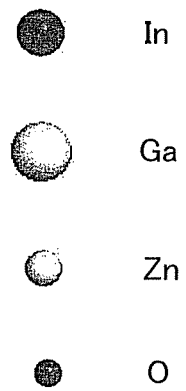

SEMICONDUCTOR DEVICE INCLUDING TWO THIN FILM TRANSISTORS AND METHOD OF MANUFACTURING THE SAME

BACKGROUND OF THE INVENTION

1. Field of the Invention

The present invention relates to a semiconductor device including an oxide semiconductor and a method of manufacturing the semiconductor device.

In this specification, a "semiconductor device" generally refers to a device that can function by utilizing semiconductor characteristics; an electrooptic device, a semiconductor circuit, and an electronic device are all included in semiconductor devices.

2. Description of the Related Art

A technique for forming a thin film transistor (TFT) by using a semiconductor thin film formed over a substrate having an insulating surface has been developed. Thin film transistors are applied to a wide range of electronic devices such as ICs and electrooptic devices, and are used as switching elements in image display devices (liquid crystal display devices and EL display devices) in particular.

An image display device (liquid crystal display device or EL display device) including thin film transistors as switching elements is called active matrix display device. An active matrix display device has the following advantage: as driver circuits for transmitting signals to a pixel portion, circuits such as a shift register circuit, a latch circuit, and a buffer circuit can be formed using TFTs on the same insulator.

However, an active matrix display device has also a disadvantage that manufacturing cost is increased when a manufacturing process of TFTs is complex. Further, since a plurality of TFTs are formed concurrently, complexity of a manufacturing process makes it difficult to ensure the yield. In particular, malfunction in a driver circuit sometimes causes a linear defect in which pixels in one column do not operate.

Disclosed in Patent Document 1 is a technique for forming a pixel portion and a driver circuit with the use of only n-channel transistors.

In addition to display devices, other various semiconductor integrated circuits such as LSIs can be manufactured by using an inverter circuit (NOT circuit), a buffer circuit, and the like in combination. In general, an inverter circuit, a buffer circuit, and the like are formed using a CMOS circuit in which an n-channel TFT and a p-channel TFT are used in combination.

REFERENCE

Patent Document

[Patent Document 1] Japanese Published Patent Application No. 2002-49333

SUMMARY OF THE INVENTION

It is an object to fowl a buffer circuit, an inverter circuit, or the like using only n-channel TFTs including an oxide semiconductor layer.

For formation of a buffer circuit or an inverter circuit using only n-channel TFTs, bootstrap operation is employed. An output portion used for formation of a buffer circuit or an inverter circuit is illustrated in FIG. 1A.

In FIG. 1A, a gate electrode of a first transistor 301 is electrically connected to a control portion 304, and a gate electrode of a second transistor 302 is also electrically connected to the control portion 304. Further, one electrode of a capacitor 303 is electrically connected to the gate electrode of the second transistor 302, and the other electrode thereof is electrically connected to a source electrode of the second transistor 302.

In the circuit illustrated in FIG. 1A, when an output signal of the circuit is at high level, OUT is controlled not to be lower than VDD by bootstrap operation. Note that FIGS. 1B and 1C illustrate how the potential of a node A in FIG. 1A is changed by bootstrap operation. Here, $V_A'$ can be obtained by the following formula.

$$V_A' = V_A + \frac{C}{C + Cp}(VDD - V_0) \quad \text{[Formula 1]}$$

In the case where the circuit illustrated in FIG. 1A or the like is used, it is important to reduce a capacitance $C_p$. In particular, when a potential difference VDD−VSS is small, a capacitance C needs to be significantly large in some cases so that $V_A'$<VDD is satisfied. In the case where a transistor including an oxide semiconductor is used for a circuit, the capacitance $C_p$ might be large depending on the structure of the transistor. When the capacitance $C_p$ in a transistor is large, the following problems occur, for example: a circuit does not easily operate, a margin is small, and desired frequency characteristics (also referred to as f characteristics) are not obtained.

In a transistor including an oxide semiconductor, when a source electrode and a drain electrode overlap with a gate electrode, the capacitance $C_p$ is large. However, when neither a source electrode nor a drain electrode overlaps with a gate electrode, the on-state current is reduced. In particular, when a source electrode does not overlap with a gate electrode in a transistor, the on-state current is remarkably reduced.

In one embodiment of the present invention, in the circuit illustrated in FIG. 1A, one end face of the gate electrode of the second transistor 302 is positioned so as to overlap with a region between the source electrode of the second transistor 302 and a drain electrode of the second transistor 302, and the other end face of the gate electrode of the second transistor 302 is positioned so as to overlap with the source electrode of the second transistor 302. Since the second transistor has such a structure, the capacitance $C_p$ can be small, and $V_A'$ can be large even in the case where the potential difference VDD−VSS is small.

One embodiment of the present invention is a semiconductor device including a first transistor; a second transistor whose source electrode is electrically connected to a drain electrode of the first transistor; and a capacitor whose one of electrodes is electrically connected to a gate electrode of the second transistor. The other electrode of the capacitor is electrically connected to the source electrode of the second transistor. A gate electrode of the first transistor overlaps with a source electrode and the drain electrode of the first transistor with a gate insulating layer therebetween. The gate electrode of the second transistor overlaps with the source electrode of the second transistor with the gate insulating layer therebetween. One end face of the gate electrode of the second transistor overlaps with a region between the source electrode of the second transistor and a drain electrode of the second transistor. The first transistor and the second transistor are n-channel transistors.

The parasitic capacitor of the second transistor 302 can be used instead of the capacitor 303. In that case, the capacitor 303 is not necessarily provided.

In the case where the capacitor 303 is not provided, one embodiment of the present invention is a semiconductor device including a first transistor; and a second transistor whose source electrode is electrically connected to a drain electrode of the first transistor. A gate electrode of the first transistor overlaps with a source electrode and the drain electrode of the first transistor with a gate insulating layer therebetween. A gate electrode of the second transistor overlaps with the source electrode of the second transistor with the gate insulating layer therebetween. One end face of the gate electrode of the second transistor overlaps with a region between the source electrode of the second transistor and a drain electrode of the second transistor. The first transistor and the second transistor are n-channel transistors.

In the above structure, a semiconductor layer of the first transistor and a semiconductor layer of the second transistor preferably contain at least indium (In) or zinc (Zn). In particular, In and Zn are preferably contained. As a stabilizer for reducing a variation in electrical characteristics among transistors including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

Since a buffer circuit or the like can be formed using only n-channel transistors, low-voltage driving is possible; thus, a semiconductor circuit whose power consumption is low can be provided.

BRIEF DESCRIPTION OF THE DRAWINGS

FIGS. 11A to 11C illustrate a structure of an oxide material according to one embodiment of the present invention.

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that modes and details disclosed herein can be modified in various ways. Therefore, the present invention is not construed as being limited to the description of the embodiments below.

[Embodiment 1]

In this embodiment, a circuit corresponding to an output portion used for formation of a buffer circuit or an inverter circuit, and an example of its configuration will be described with reference to FIG. 1A and FIGS. 2A and 2B.

Figure 1A:
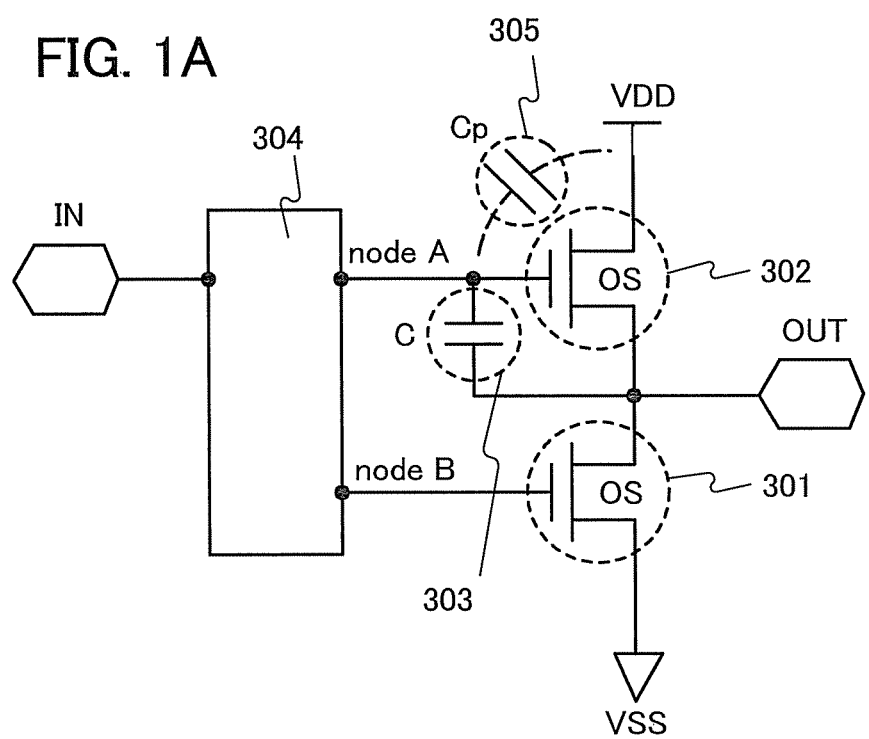
FIGS. 1A to 1C are circuit diagrams illustrating one embodiment of the present invention.

A circuit illustrated in FIG. 1A includes the first transistor 301, the second transistor 302 whose source electrode is electrically connected to a drain electrode of the first transistor 301, and the capacitor 305 whose one of electrodes is electrically connected to a gate electrode of the second transistor 302. The other electrode of the capacitor 303 is electrically connected to the source electrode of the second transistor 302.

Figure 2A:
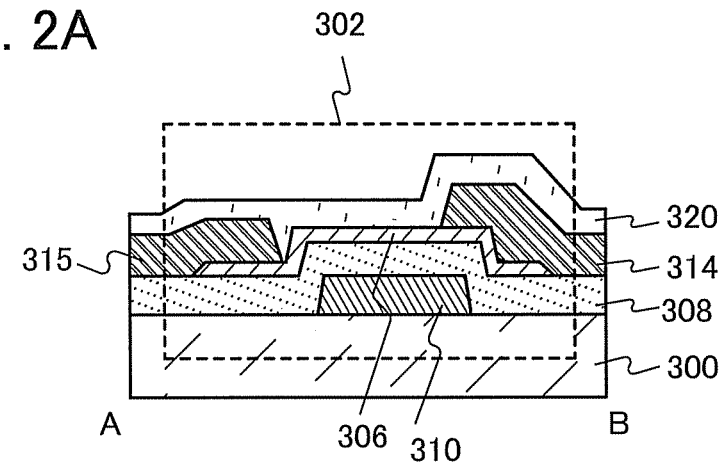
FIGS. 2A and 2B are a cross-sectional structural view and a top view illustrating one embodiment of the present invention.
Figure 2B:
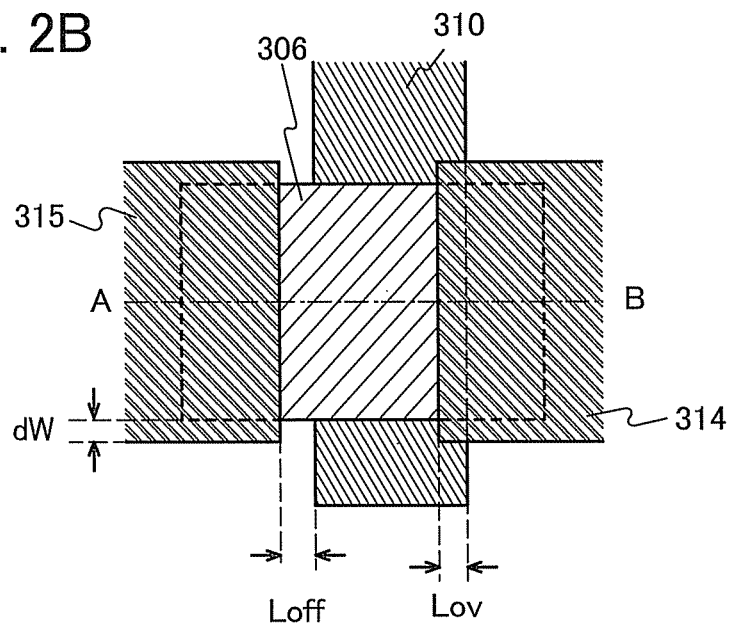

FIG. 2B is a top view of the second transistor 302. FIG. 2A is a cross-sectional view taken along dashed-dotted line A-B in FIG. 2B.

As illustrated in FIG. 2B, a drain electrode 315 of the second transistor is disposed so as not to overlap with a gate electrode 310 of the second transistor. That is, one end face of the gate electrode is positioned between a source electrode 314 and the drain electrode 315 of the second transistor. In FIG. 2B, $L_{off}$ denotes the distance in the channel length direction between the end face of the gate electrode 310 and the drain electrode 315 of the second transistor. The longer $L_{off}$ is, the smaller $C_p$ of a capacitor 305 becomes.

Further, as illustrated in FIG. 2B, the source electrode 314 of the second transistor overlaps with the gate electrode 310 of the second transistor. In FIG. 2B, $L_{ov}$ denotes the distance in the channel length direction between the other end face of the gate electrode 310 and the source electrode 314 of the second transistor (this distance is also referred to as overlap length). Further, the width of a portion of the source electrode 314 (or the drain electrode 315), which does not overlap with an oxide semiconductor layer 306, is referred to as dW.

A manufacturing process of the second transistor 302 including an oxide semiconductor will be described below.

First, over a substrate 300, an insulating layer serving as a base layer is formed with a thickness greater than or equal to 50 nm and less than or equal to 300 nm, preferably greater than or equal to 100 nm and less than or equal to 200 nm. As the substrate 300, as well as a glass substrate or a ceramic substrate, a plastic substrate or the like having heat resistance high enough to withstand a process temperature in this manufacturing process can be used. In the case where a substrate does not need a light-transmitting property, a metal substrate such as a stainless steel alloy substrate or a semiconductor substrate, whose surface is provided with an insulating layer, may be used.

The base layer can be formed with a single-layer structure or a layered structure using one or more of the following insulating layers: an aluminum nitride layer, an aluminum oxynitride layer, a silicon nitride layer, a silicon oxide layer, a silicon nitride oxide layer, and a silicon oxynitride layer. The base layer has a function of preventing diffusion of impurity elements from the substrate 300. Note that the base layer is not necessarily provided.

Next, over the base layer, a conductive layer is formed with a thickness greater than or equal to 100 nm and less than or equal to 500 nm, preferably greater than or equal to 200 nm and less than or equal to 300 nm by a sputtering method, a vacuum evaporation method, or a plating method, a resist mask is formed by a first photolithography step, and the conductive layer is selectively removed by etching, whereby the gate electrode 310 is formed.

The conductive layer for forming the gate electrode 310 can be formed with a single-layer structure or a layered structure using a metal material such as molybdenum (Mo), titanium (Ti), tungsten (W), tantalum (Ta), aluminum (Al), copper (Cu), chromium (Cr), neodymium (Nd), or scandium (Sc), or an alloy material containing any of these elements as its main component.

Since the conductive layer is formed into a wiring, it is preferable to use Al or Cu which is a low-resistance material. When Al or Cu is used, signal delay is reduced, so that higher image quality can be realized. Note that Al has low heat resistance; therefore, defects due to a hillock, a whisker, or migration tend to be caused. In order to prevent migration of Al, a layered structure including Al and a metal material having a higher melting point than Al such as Mo, Ti, or W is preferably used. In the case where a material containing Al is used for the conductive layer, the maximum process temperature in later steps is preferably lower than or equal to 380° C., further preferably lower than or equal to 350° C.

Then, a gate insulating layer 308 is formed with a thickness greater than or equal to 5 nm and less than or equal to 300 nm, preferably greater than or equal to 10 nm and less than or equal to 200 nm over the gate electrode 310. The gate insulating layer 308 can be formed using silicon oxide, silicon oxynitride, silicon nitride oxide, aluminum oxide, aluminum oxynitride, aluminum nitride oxide, tantalum oxide, gallium oxide, yttrium oxide, hafnium oxide, hafnium silicate (HfSi$_x$O$_y$ (x>0, y>0)), hafnium silicate to which nitrogen is added, hafnium aluminate to which nitrogen is added, or the like by a plasma CVD method, a sputtering method, or the like. The gate insulating layer 308 is not limited to a single layer, and a stack of different layers may be used.

In order that the oxide semiconductor layer to be formed contains hydrogen, a hydroxyl group, and moisture as little as possible, it is preferable to preheat the substrate 300 in a preheating chamber of a sputtering apparatus as pretreatment before the formation of the oxide semiconductor layer so that impurities such as hydrogen and moisture adsorbed on the substrate 300 or the gate insulating layer 308 are eliminated and removed.

In this embodiment, an In—Sn—Zn—O film which is an oxide semiconductor film is formed with a thickness of 15 nm Preferably, an In—Sn—Zn—O target having an atomic ratio of In:Sn:Zn=2:1:3, 1:2:2, 1:1:1, or 20:45:35 is used. When the oxide semiconductor film is formed using an In—Sn—Zn—O target having the aforementioned composition ratio, a polycrystal or a CAAC (c-axis aligned crystal) is likely to be formed.

The In—Sn—Zn—O film is formed with a sputtering apparatus with a power of 100 W (DC) in a mixed atmosphere having a volume ratio of argon:oxygen=2:3. In this embodiment, an In—Sn—Zn—O target having an atomic ratio of In:Sn:Zn=1:1:1 is used. Note that the substrate heating temperature in film formation is 200° C.

In order to remove moisture remaining in a film formation chamber, an entrapment vacuum pump such as a cryopump, an ion pump, or a titanium sublimation pump is preferably used. As an evacuation unit, a turbo molecular pump provided with a cold trap may be used. In the film formation chamber which is evacuated with the cryopump, a hydrogen atom, a compound containing a hydrogen atom such as water (H$_2$O) (more preferably, also a compound containing a carbon atom), and the like are removed, whereby the impurity concentration in the oxide semiconductor layer formed in the film formation chamber can be reduced.

Then, heat treatment is performed. The heat treatment is performed in a reduced-pressure atmosphere, an inert atmosphere, or an oxidation atmosphere. By the heat treatment, the impurity concentration in the oxide semiconductor film can be reduced.

The heat treatment is preferably performed in such a manner that after heat treatment is performed in a reduced-pressure atmosphere or an inert atmosphere, the atmosphere is changed to an oxidation atmosphere with the temperature maintained and heat treatment is further performed. When the heat treatment is performed in a reduced-pressure atmosphere or an inert atmosphere, the impurity concentration in the oxide semiconductor film can be effectively reduced; however, oxygen deficiency is caused at the same time. By the heat treatment in the oxidation atmosphere, the caused oxygen deficiency can be reduced.

In this embodiment, heat treatment in a nitrogen atmosphere is first performed for one hour and heat treatment in an oxygen atmosphere is further performed for one hour with the temperature kept at 250° C. to 650° C.

Next, the oxide semiconductor film is processed by a second photolithography step, so that the oxide semiconductor layer 306 is formed. In this embodiment, etching of the oxide semiconductor film is performed by dry etching. As an etching gas, $BCl_3$ or $Cl_2$ is used. A dry etching apparatus using a high-density plasma source such as ECR or ICP is used to improve the etching rate.

Next, a metal film for forming electrodes functioning as a source electrode and a drain electrode is formed. The metal film can be formed using a metal material such as molybdenum, titanium, tantalum, tungsten, aluminum, copper, chromium, neodymium, or scandium, or an alloy material containing any of these materials as its main component. The metal film may have a single-layer structure or a layered structure.

Next, the metal film is processed by a third photolithography step, so that the source electrode 314 and the drain electrode 315 are formed. The positions of the source electrode 314 and the drain electrode 315 of the second transistor depend on a photomask used in the third photolithography step. The gate electrode 310 of the second transistor 302 overlaps with the source electrode 314 of the second transistor with the gate insulating layer therebetween, and the one end face of the gate electrode of the second transistor is positioned so as to overlap with a region between the source electrode 314 and the drain electrode 315 of the second transistor.

Next, a protective insulating film 320 is formed to cover the source electrode 314 and the drain electrode 315. As the protective insulating film 320, an insulating film providing favorable step coverage is preferably used. The protective insulating film 320 can be formed using a silicon oxide film, a gallium oxide film, an aluminum oxide film, a silicon oxynitride film, an aluminum oxynitride film, or a silicon nitride oxide film. In this embodiment, as the protective insulating film 320, a silicon oxide film is formed with a thickness of 300 nm by a sputtering method. The silicon oxide film can be formed by a sputtering method under a rare gas (typically, argon) atmosphere, an oxygen atmosphere, or a mixed atmosphere of a rare gas and oxygen. As a target, silicon oxide or silicon can be used. For example, a silicon oxide film can be formed by sputtering under an atmosphere containing oxygen with the use of silicon for the target.

In order to remove remaining moisture from a film formation chamber at the time of formation of the protective insulating film 320, an entrapment vacuum pump (e.g., a cryopump) is preferably used. It is preferable that a high-purity gas from which impurities such as hydrogen, water, a hydroxyl group, and a hydride have been removed be used as a sputtering gas for the formation of the protective insulating film 320.

Then, second heat treatment may be performed under a reduced-pressure atmosphere, an inert gas atmosphere, an oxygen gas atmosphere, or an ultra-dry air atmosphere (preferably at a temperature higher than or equal to 200° C. and lower than or equal to 600° C., for example, higher than or equal to 250° C. and lower than or equal to 550° C.). By the second heat treatment, part of the oxide semiconductor layer (a channel formation region) is heated in the state of being in contact with the protective insulating film 320, so that oxygen can be supplied from the protective insulating film 320 containing oxygen to the oxide semiconductor layer 306. It is preferable that the above atmosphere do not contain water, hydrogen, and the like.

Through the above steps, the second transistor 302 illustrated in FIGS. 2A and 2B can be manufactured.

In the first transistor 301, the positions of the source electrode and the drain electrode depend on the photomask used in the third photolithography step, and the source electrode and the drain electrode overlap with the gate electrode with the gate insulating layer therebetween.

In this embodiment, a top surface of the oxide semiconductor layer in the second transistor 302 has a rectangular shape; however, one embodiment of the present invention is not particularly limited to this, and the drain electrode 315 may be partly surrounded by the U-shaped (C-shaped, reversed C-shaped, or horseshoe-shaped) source electrode 314. With such a shape, an enough channel width can be ensured even when the area of the transistor is small, and accordingly, the amount of current flowing at the time of conduction of the transistor (also referred to as the on-state current) can be increased.

[Embodiment 2]

In this embodiment, an example where the capacitor 303 in FIG. 1A is not provided will be described.

Figure 3:
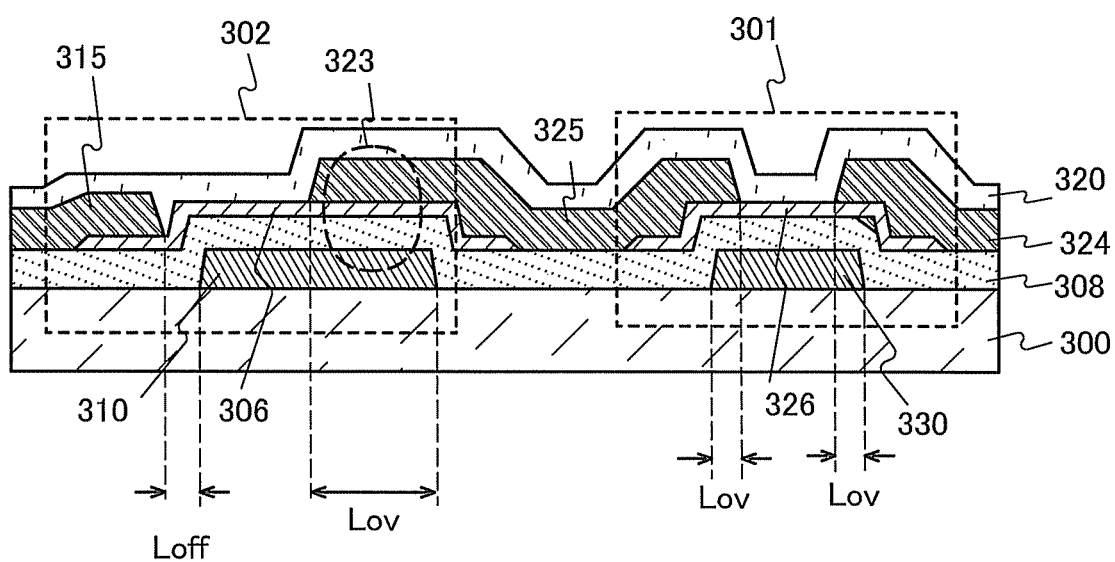
FIG. 3 is a cross-sectional structural view illustrating one embodiment of the present invention.

Instead of the capacitor 303 in FIG. 1A, a parasitic capacitor 323 is used as illustrated in FIG. 3 so that driving can be performed in almost the same manner as that of the circuit illustrated in FIG. 1A.

A connection electrode 325 functioning as a source electrode of the second transistor 302 also functions as one electrode of the parasitic capacitor. The capacitance can be increased by increasing the area of a region where the connection electrode 325 overlaps with the gate electrode 310 of the second transistor 302, that is, by lengthening $L_{ov}$.

As in Embodiment 1, a drain electrode of the second transistor does not overlap with the gate electrode 310 of the second transistor 302, and the distance between the gate electrode 310 and the drain electrode 315 is denoted by $L_{off}$ (also referred to as offset length).

The connection electrode 325 also functions as a drain electrode of the first transistor 301.

A gate electrode 330 of the first transistor 301 overlaps with both a source electrode 324 and the connection electrode 325. Further, the width of a region where the source electrode 324 and the gate electrode 330 overlap with each other and the width of a region where the connection electrode 325 and the gate electrode 330 overlap with each other are almost the same, $L_{ov}$.

In this embodiment, the capacitor 303 is not necessarily provided; thus, the area occupied by the circuit can be decreased as compared to Embodiment 1.

This embodiment can be implemented in appropriate combination with Embodiment 1.

[Embodiment 3]

Figure 1B:
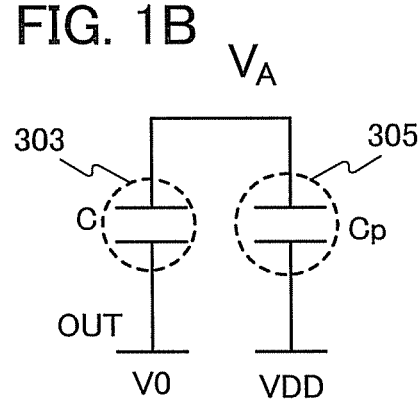
Figure 1C:
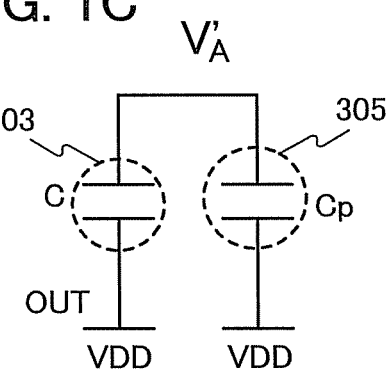

The field-effect mobility of the first transistor 301 used in the circuit illustrated in FIGS. 1A to 1C in Embodiment 1 is preferably high. For this reason, a transistor having a field-effect mobility higher than 10, preferably higher than or equal to 30, more preferably higher than or equal to 50 is used. The second transistor 302 is formed through the same process as the first transistor, and has a structure in which a source electrode overlaps with a gate electrode, and a drain electrode does not overlap with the gate electrode. Consequently, even in the case where a potential difference VDD−VSS is small, $V_A'$ can be large. A reduction in on-state current does not become a problem as long as a semiconductor material with which particularly high field-effect mobility can be obtained, specifically an In—Sn—Zn—O film, is used for a semiconductor layer.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at the interface between the semiconductor and an insulating film. When a Levinson model is used, the field-effect mobility that is based on the assumption that no defect exists inside the semiconductor can be calculated theoretically.

A top-gate transistor is used in the following calculation; however, similar field-effect mobility can be obtained even in the case where a bottom-gate transistor is used.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height E of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[Formula 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W\mu_0 V_g V_d C_{ox}}{L} \exp\left(-\frac{E}{kT}\right) \quad \text{[Formula 4]}$$

Here, L represents the channel length and W represents the channel width, and L and W are each 10 μm. Further, $V_d$ represents the drain voltage. When dividing both sides of the above equation by $V_g$ and then taking logarithms of both sides, the following formula can be obtained.

$$\ln\left(\frac{I_d}{V_g}\right) = \quad \text{[Formula 5]}$$
$$\ln\left(\frac{W\mu_0 V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$–$V_g$ characteristics of the transistor. The defect density, N of an oxide semiconductor in which the ratio of indium (In), tin (Sn), and zinc (Zn) is 1:1:1 is approximately $1\times10^{12}/cm^2$.

On the basis of the defect density obtained in this manner, $\mu_0$ can be calculated to be 120 $cm^2$/Vs from Formula 2 and Formula 3. The measured mobility of an In—Sn—Zn oxide including a defect is approximately 35 $cm^2$/Vs. However, assuming that no defect exists inside the semiconductor and at the interface between the semiconductor and an insulating film, the mobility $\mu_0$ of the oxide semiconductor is expected to be 120 $cm^2$Vs.

Note that even when no defect exists inside a semiconductor, scattering at the interface between a channel formation region and a gate insulating layer adversely affects the transport property of the transistor. In other words, the mobility $\mu_1$ at a position that is distance x away from the interface between the channel formation region and the gate insulating layer can be expressed as the following formula.

$$\frac{1}{\mu_1} = \frac{1}{\mu_0} + \frac{D}{B}\exp\left(-\frac{x}{G}\right) \quad \text{[Formula 6]}$$

Here, D represents the electric field in the gate direction, and B and G are constants. Note that B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 4:
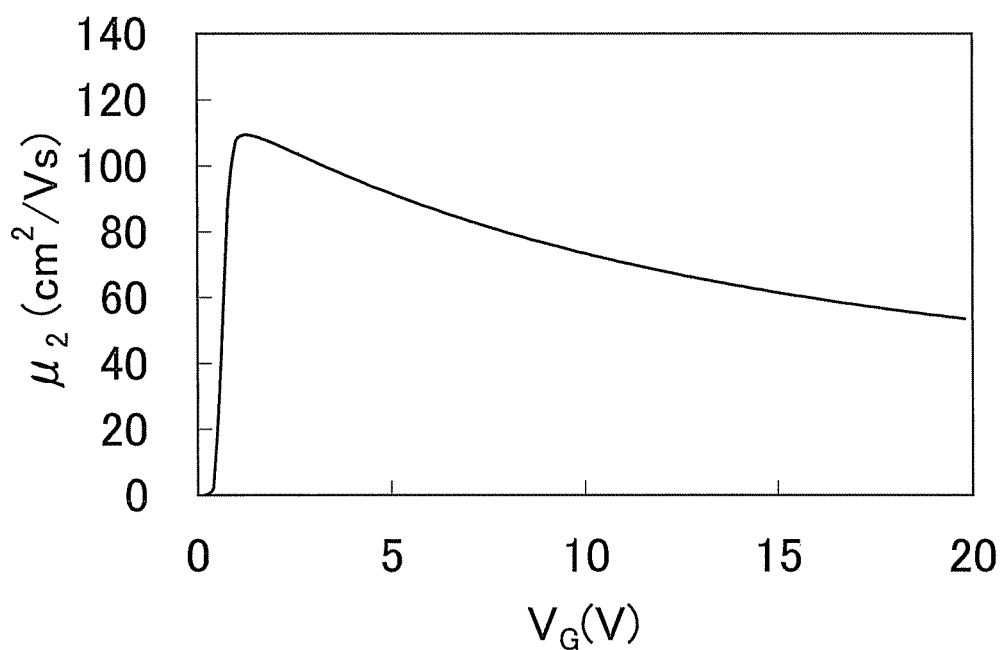
FIG. 4 shows gate voltage dependence of mobility obtained by calculation.

FIG. 4 shows calculation results of the mobility $\mu_2$ of a transistor whose channel formation region is farmed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate electrode, a source electrode, and a drain electrode were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 4, the mobility has a peak of 100 $cm^2$/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness). Specifically, the semiconductor layer may be formed on a surface with an average surface roughness ($R_a$) of 1 nm or less, preferably 0.3 nm or less, more preferably 0.1 nm or less.

Note that $R_a$ is obtained by expanding, into three dimensions, center line average roughness that is defined by JIS B 0601 so as to be applied to a surface. Moreover, $R_a$ can be expressed as an "average value of the absolute values of deviations from a reference surface to a designated surface" and is defined by the following formula.

$$Ra = \frac{1}{S_0}\int_{y_1}^{y_2}\int_{x_1}^{x_2}|f(x,y) - Z_0|dxdy \quad \text{[Formula 7]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents the average height of the plane to be measured. Further, $R_a$ can be measured using an atomic force microscope (AFM).

Calculation results of characteristics of minute transistors formed using an oxide semiconductor having such a mobility are shown in FIGS. 5A to 5C, FIGS. 6A to 6C, and FIGS. 7A to 7C. FIGS. 8A and 8B illustrate cross-sectional structures of the transistors used for the calculation. The transistors illustrated in FIGS. 8A and 8B each include a semiconductor region 103a and a semiconductor region 103c that have n+-type conductivity in an oxide semiconductor layer. The resistivity of the semiconductor regions 103a and 103c is $2 \times 10^{-3}$ Ωcm.

The transistor in FIG. 8A is formed over a base insulator 101 and an embedded insulator 102 that is embedded in the base insulator 101 and formed of aluminum oxide. The transistor includes the semiconductor region 103a, the semiconductor region 103c, an intrinsic semiconductor region 103b that is placed between the semiconductor regions 103a and 103c and serves as a channel formation region, and a gate electrode 105. The width of the gate electrode 105 is 33 nm.

A gate insulating layer 104 is formed between the gate electrode 105 and the semiconductor region 103b. A sidewall insulator 106a and a sidewall insulator 106b are formed on both side surfaces of the gate electrode 105, and an insulator 107 is formed over the gate electrode 105 so as to prevent a short circuit between the gate electrode 105 and another wiring. The sidewall insulator has a width of 5 nm. A source electrode 108a and a drain electrode 108b are provided in contact with the semiconductor region 103a and the semiconductor region 103c, respectively. Note that the channel width of this transistor is 40 nm.

The transistor in FIG. 8B is the same as the transistor in FIG. 8A in that it is formed over the base insulator 101 and the embedded insulator 102 formed of aluminum oxide and that it includes the semiconductor region 103a, the semiconductor region 103c, the intrinsic semiconductor region 103b provided therebetween, the gate electrode 105 having a width of 33 nm, the gate insulating layer 104, the sidewall insulator 106a, the sidewall insulator 106b, the insulator 107, the source electrode 108a, and the drain electrode 108b.

The difference between the transistor in FIG. 8A and the transistor in FIG. 8B is the conductivity type of semiconductor regions under the sidewall insulators 106a and 106b. In the transistor in FIG. 8A, the semiconductor regions under the sidewall insulator 106a and the sidewall insulator 106b are part of the semiconductor region 103a having n+-type conductivity and part of the semiconductor region 103c having n+-type conductivity, whereas in the transistor in FIG. 8B, the semiconductor regions under the sidewall insulator 106a and the sidewall insulator 106b are part of the intrinsic semiconductor region 103b. In other words, in the semiconductor layer of FIG. 8B, a region having a width of $L_{off}$ which overlaps with neither the semiconductor region 103a (the semiconductor region 103c) nor the gate electrode 105 is provided. This region is called an offset region, and the width $L_{off}$ is called an offset length. As is seen from the drawing, the offset length is equal to the width of the sidewall insulator 106a (the sidewall insulator 106b).

The first transistor 301 in FIG. 3 is of a bottom-gate type, and has a structure equivalent to those of the transistors in FIG. 8A and FIG. 8B. That is, the semiconductor region 103b overlapping with the gate electrode 105 in FIGS. 8A and 8B corresponds to an oxide semiconductor layer 326 in FIG. 3, and the semiconductor region 103a and the semiconductor region 103c having n+-type conductivity in FIGS. 8A and 8B correspond to a portion where the source electrode 324 is in contact with the oxide semiconductor layer 326 and a portion where the connection electrode 325 is in contact with the oxide semiconductor layer 326 in FIG. 3. Therefore, the interface state between the gate insulating layer 308 and the oxide semiconductor layer 326 and the interface state between the oxide semiconductor layer 326 and the protective insulating film 320 are reduced, whereby such high field-effect mobility as is shown in the calculation results can be obtained.

Figure 5A:
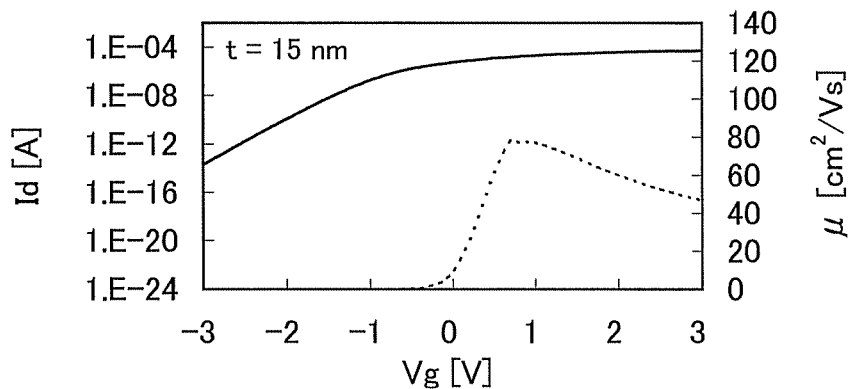
FIGS. 5A to 5C each show gate voltage dependence of drain current and mobility obtained by calculation.
Figure 5B:
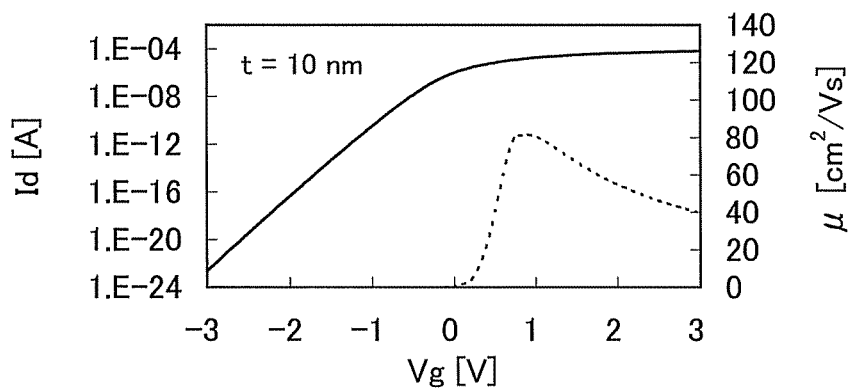
Figure 5C:
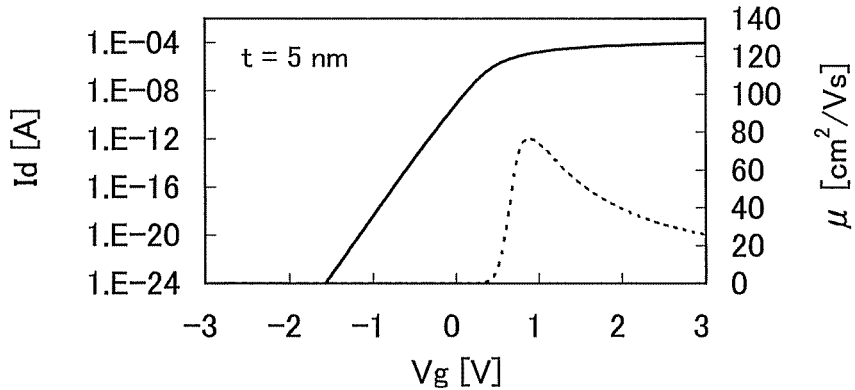

The other parameters used in calculation are as described above. For the calculation, device simulation software Sentaurus Device manufactured by Synopsys, Inc. was used. FIGS. 5A to 5C show the gate voltage ($V_g$: a potential difference between the gate electrode and the source electrode) dependence of the drain current ($I_d$, a solid line) and the mobility ($\mu$, a dotted line) of the transistor having the structure illustrated in FIG. 8A. The drain current $I_d$ is obtained by calculation under the assumption that the drain voltage (a potential difference between the drain electrode and the source electrode) is +1 V, and the mobility $\mu$ is obtained by calculation under the assumption that the drain voltage is +0.1 V.

FIG. 5A shows the gate voltage dependence of the transistor in the case where the thickness of the gate insulating film is 15 nm, FIG. 5B shows that of the transistor in the case where the thickness of the gate insulating film is 10 nm, and FIG. 5C shows that of the transistor in the case where the thickness of the gate insulating film is 5 nm.

Figure 6A:
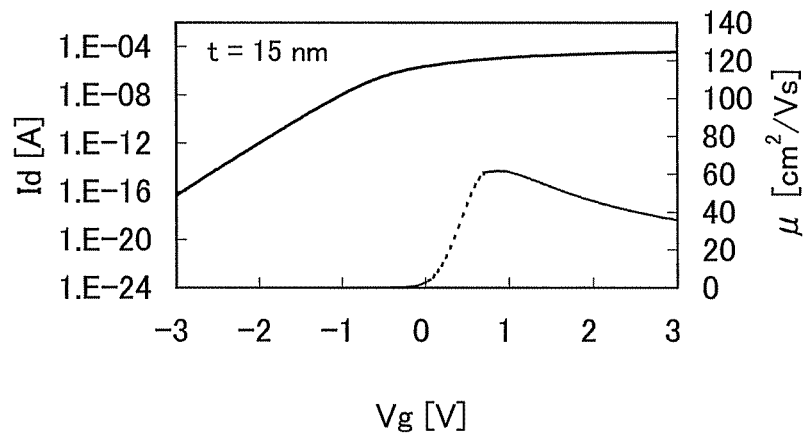
FIGS. 6A to 6C each show gate voltage dependence of drain current and mobility obtained by calculation.
Figure 6B:
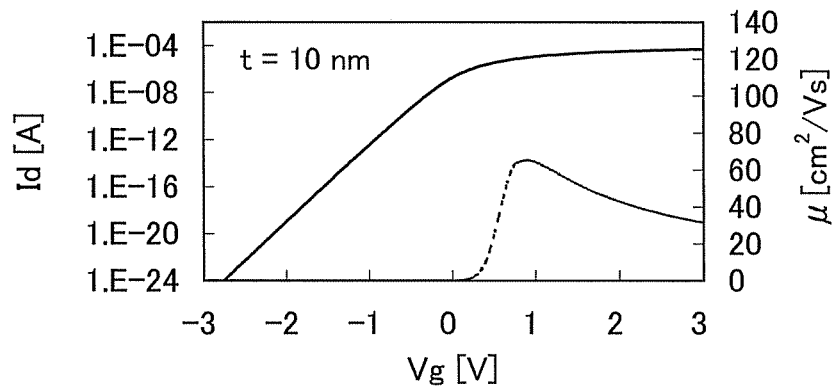
Figure 6C:
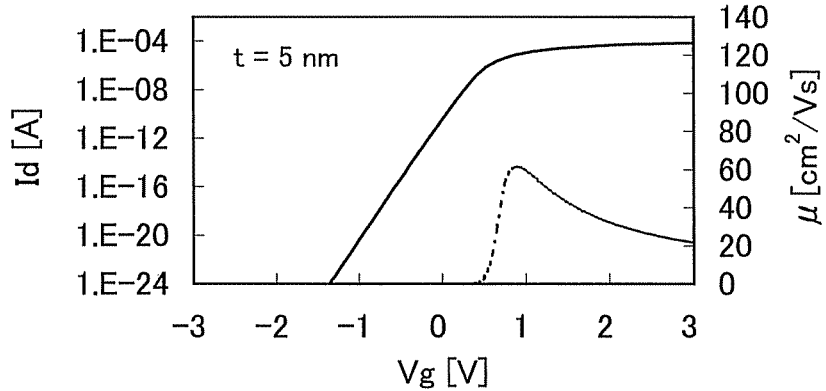

FIGS. 6A to 6C show the gate voltage $V_g$ dependence of the drain current $I_d$ (a solid line) and the mobility $\mu$ (a dotted line) of the transistor having the structure in FIG. 8B and an offset length $L_{off}$ of 5 nm. The drain current $I_d$ is obtained by calculation under the assumption that the drain voltage $V_d$ is +1 V and the mobility $\mu$ is obtained by calculation under the assumption that the drain voltage is +0.1 V. FIG. 6A shows the gate voltage dependence of the transistor in the case where the thickness of the gate insulating film is 15 nm, FIG. 6B shows that of the transistor in the case where the thickness of the gate insulating film is 10 nm, and FIG. 6C shows that of the transistor in the case where the thickness of the gate insulating film is 5 nm.

Figure 7A:
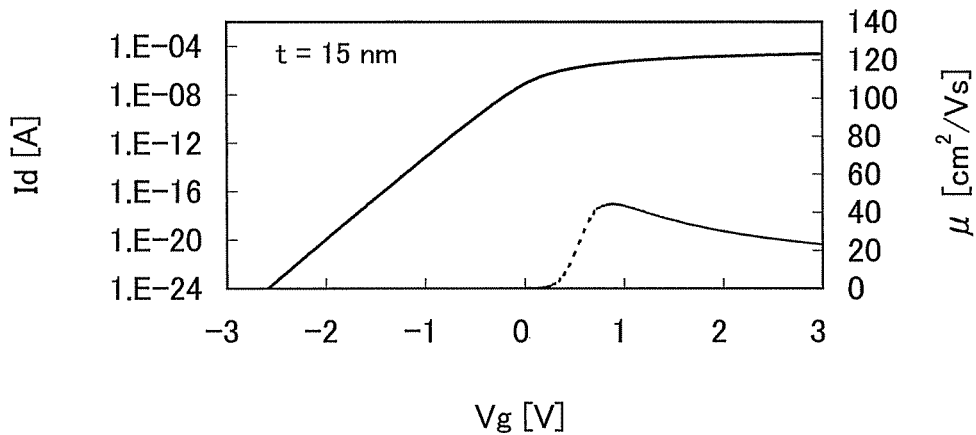
FIGS. 7A to 7C each show gate voltage dependence of drain current and mobility obtained by calculation.
Figure 7B:
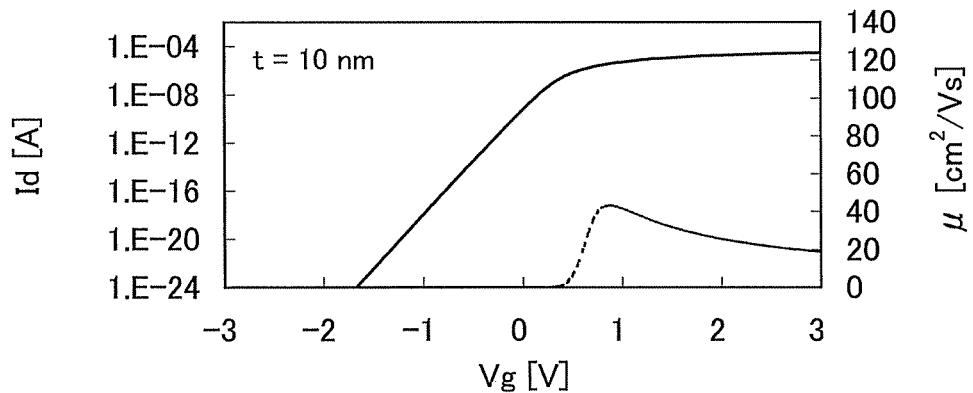
Figure 7C:
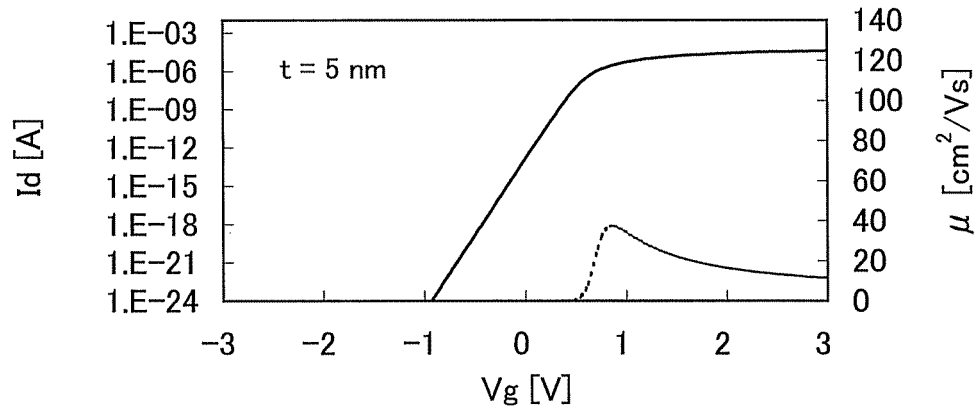
Figure 8A:
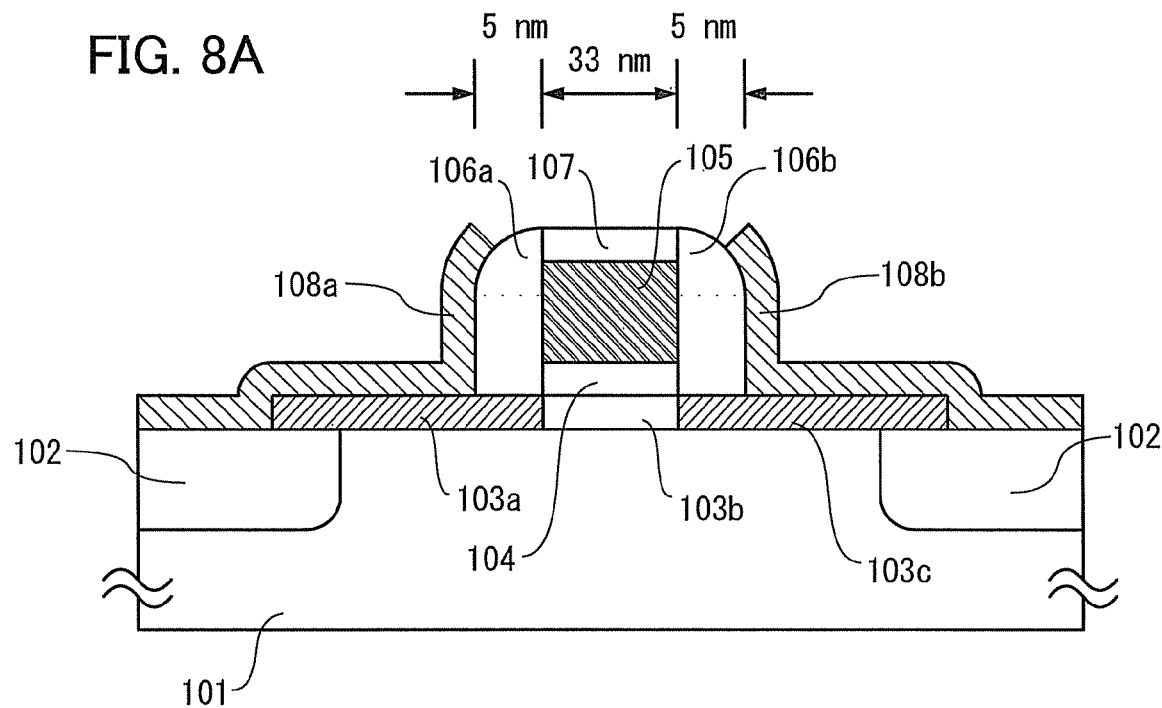
FIGS. 8A and 8B illustrate cross-sectional structures of transistors used for calculation.
Figure 8B:
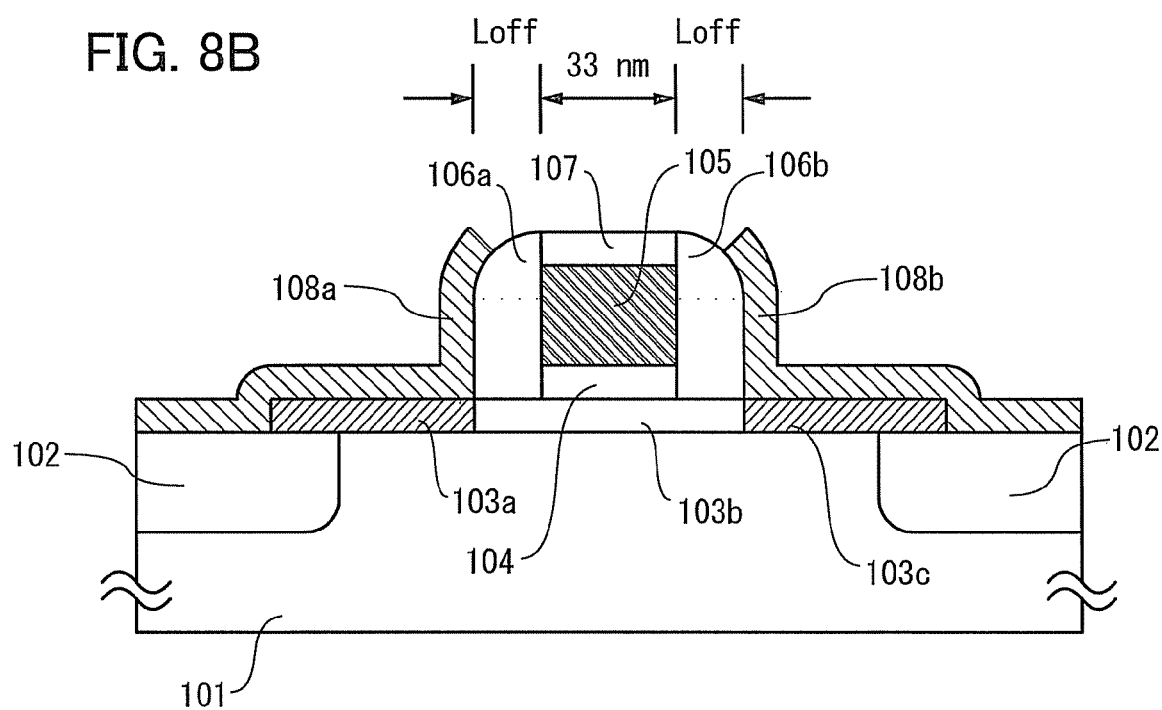

FIGS. 7A to 7C show the gate voltage dependence of the drain current $I_d$ (a solid line) and the mobility $\mu$ (a dotted line) of the transistor having the structure in FIG. 8B and an offset length $L_{off}$ of 15 nm. The drain current $I_d$ is obtained by calculation under the assumption that the drain voltage. $V_d$ is +1 V and the mobility $\mu$ is obtained by calculation under the assumption that the drain voltage is +0.1 V. FIG. 7A shows the gate voltage dependence of the transistor in the case where the thickness of the gate insulating film is 15 nm, FIG. 7B shows that of the transistor in the case where the thickness of the gate insulating film is 10 nm, and FIG. 7C shows that of the transistor in the case where the thickness of the gate insulating film is 5 nm.

Note that the peak of the mobility $\mu$ is approximately 80 cm$^2$/Vs in FIGS. 5A to 5C, approximately 60 cm$^2$/Vs in FIGS. 6A to 6C, and approximately 40 cm$^2$/Vs in FIGS. 7A to 7C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

[Embodiment 4]

In this embodiment, an oxide including a crystal with c-axis alignment (also referred to as c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 9A to 9E, FIGS. 10A to 10C, and FIGS. 11A to 11C. In FIGS. 9A to 9E, FIGS. 10A to 10C, and FIGS. 11A to 11C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 9A to 9E, O surrounded by a circle represents tetracoordinate O and O surrounded by a double circle represents tricoordinate O.

Figure 9A:
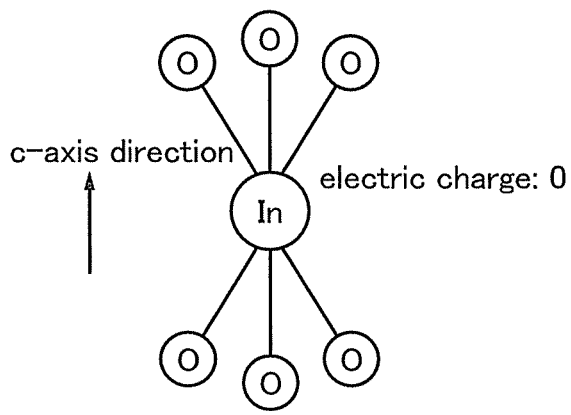
FIGS. 9A to 9E illustrate structures of oxide materials according to one embodiment of the present invention.

FIG. 9A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 9A is actually an octahedral structure, but is illustrated as a planar structure for simplicity. Note that three tetracoordinate O atoms exist in each of an upper half and a lower half in FIG. 9A. In the small group illustrated in FIG. 9A, electric charge is 0.

Figure 9D:
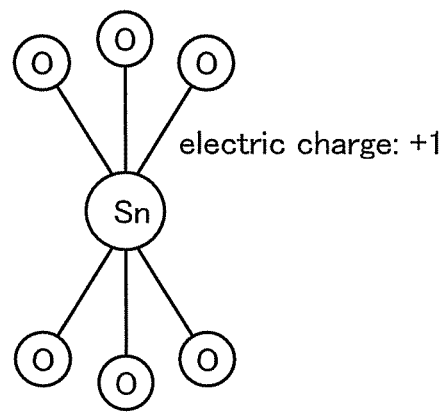
Figure 9B:
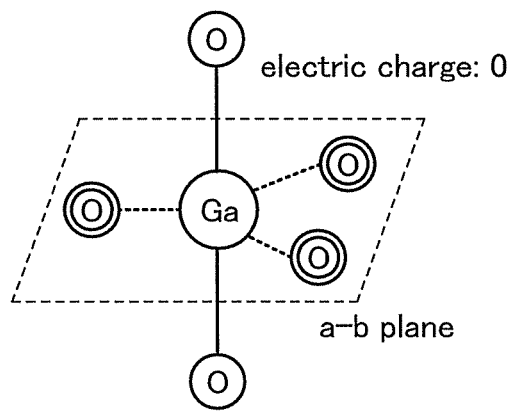

FIG. 9B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 9B. An In atom can also have the structure illustrated in FIG. 9B because an In atom can have five ligands. In the small group illustrated in FIG. 9B, electric charge is 0.

Figure 9E:
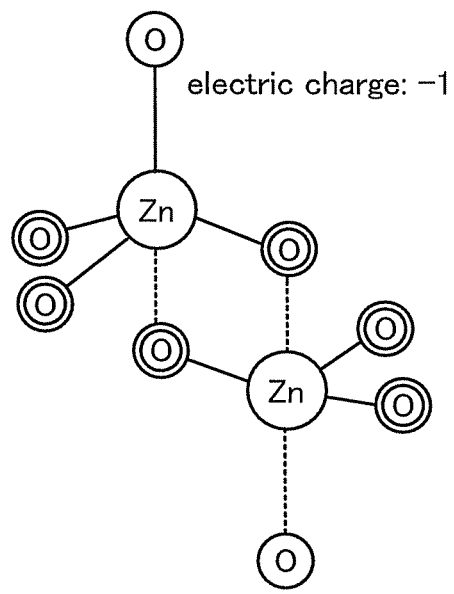
Figure 9C:
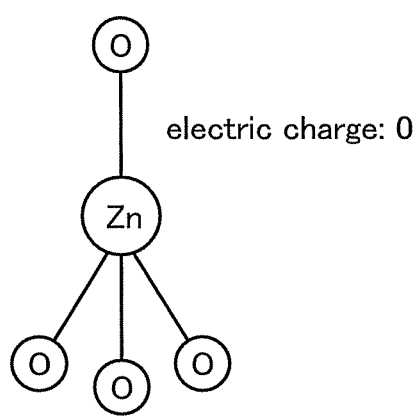

FIG. 9C illustrates a structure including one tetracoordinate Zn atom and four tetracoordinate O atoms proximate to the Zn atom. In FIG. 9C, one tetracoordinate O atom exists in an upper half and three tetracoordinate O atoms exist in a lower half.

Alternatively, three tetracoordinate O atoms may exist in the upper half and one tetracoordinate O atom may exist in the lower half in FIG. 9C. In the small group illustrated in FIG. 9C, electric charge is 0.

FIG. 9D illustrates a structure including one hexacoordinate Sn atom and six tetracoordinate O atoms proximate to the Sn atom. In FIG. 9D, three tetracoordinate O atoms exist in each of an upper half and a lower half. In the small group illustrated in FIG. 9D, electric charge is +1.

FIG. 9E illustrates a small group including two Zn atoms. In FIG. 9E, one tetracoordinate O atom exists in each of an upper half and a lower half. In the small group illustrated in FIG. 9E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 9A each have three proximate In atoms in the downward direction, and the three O atoms in the lower half each have three proximate In atoms in the upward direction. The one O atom in the upper half with respect to the pentacoordinate Ga atom in FIG. 9B has one proximate Ga atom in the downward direction, and the one O atom in the lower half has one proximate Ga atom in the upward direction. The one O atom in the upper half with respect to the tetracoordinate Zn atom in FIG. 9C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason will be described hereinafter. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 10A:
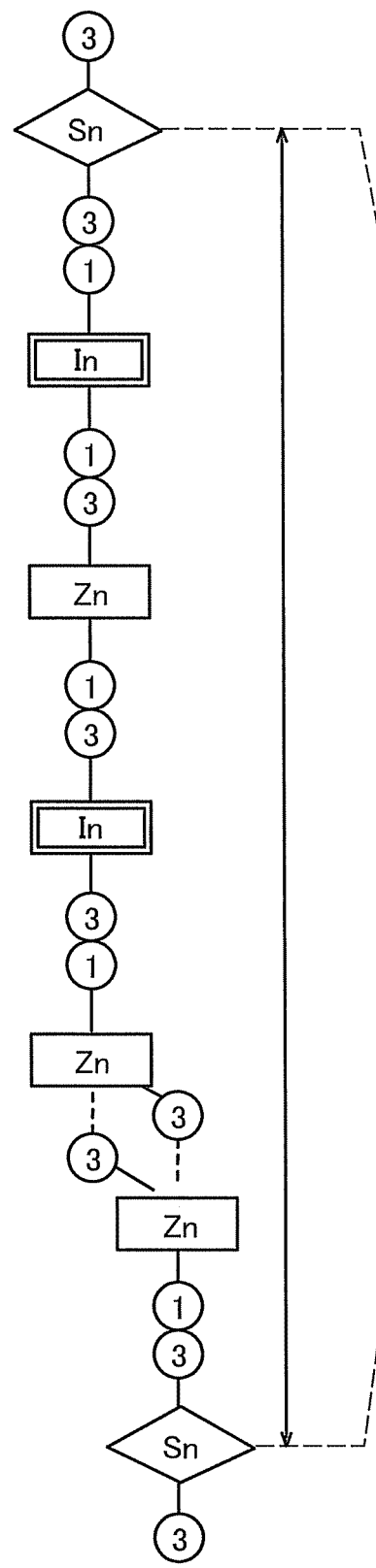
FIGS. 10A to 10C illustrate a structure of an oxide material according to one embodiment of the present invention.
Figure 10B:
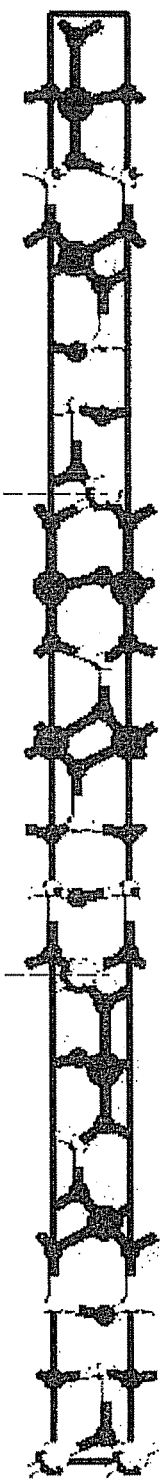
Figure 10C:
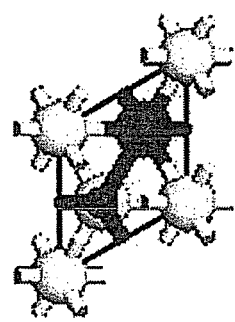

FIG. 10A illustrates a model of a medium group included in a layered structure of an In—Sn—Zn—O-based material. FIG. 10B illustrates a large group including three medium groups. Note that FIG. 10C illustrates an atomic arrangement in the case where the layered structure in FIG. 10B is observed from the c-axis direction.

In FIG. 10A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 10A, one tetracoordinate O atom existing in each of an upper half and a lower half with respect to an In atom is denoted by circled 1. FIG. 10A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 10A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 9E can be given. For example, with one small group including two Zn atoms, electric charge of one small group including a Sn atom can be cancelled, so that the total electric charge of the layered structure can be 0.

When the large group illustrated in FIG. 10B is repeated, an In—Sn—Zn—O-based crystal (In$SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

As an example, FIG. 11A illustrates a model of a medium group included in a layered structure of an In—Ga—Zn—O-based material.

In the medium group included in the layered structure of the In—Ga—Zn—O-based material in FIG. 11A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 11B illustrates a large group including three medium groups. Note that FIG. 11C illustrates an atomic arrangement in the case where the layered structure in FIG. 11B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be fanned using not only the medium group illustrated in FIG. 11A but also a medium group in which the arrangement of the In atom, the Ga atom, and the Zn atom is different from that in FIG. 11A.

The CAAC described above can be obtained through the manufacturing process described in Embodiment 1. The CAAC is likely to be formed on a surface with an average surface roughness ($R_a$) of 1 nm or less, preferably 0.3 nm or less, more preferably 0.1 nm or less. Further, the CAAC is easily formed when the heating temperature during deposition is high.

This embodiment can be implemented in appropriate combination with any of the other embodiment.

This application is based on Japanese Patent Application serial no. 2011-108844 filed with Japan Patent Office on May 13, 2011, the entire contents of which are hereby incorporated by reference.

What is claimed is:
1. A semiconductor device comprising:
a first gate electrode over a substrate;
a second gate electrode over the substrate;
a first insulating layer over the first gate electrode and the second gate electrode;
a first semiconductor layer over the first insulating layer, the first semiconductor layer overlapping with the first gate electrode;
a second semiconductor layer over the first insulating layer, the second semiconductor layer overlapping with the second gate electrode;
a first electrode over the first semiconductor layer and the second semiconductor layer, the first electrode being electrically connected to the first semiconductor layer and the second semiconductor layer;
a second electrode over the first semiconductor layer, the second electrode being electrically connected to the first semiconductor layer;
a third electrode over the second semiconductor layer, the third electrode being electrically connected to the second semiconductor layer; and
a second insulating layer over the first electrode, the second electrode and the third electrode, wherein a first portion of the first electrode overlaps with a portion of the first gate electrode,
wherein a second portion of the first electrode overlaps with a first portion of the second gate electrode,
wherein the second insulating layer is in contact with the first semiconductor layer over a region where the first insulating layer is in contact with the substrate,
wherein a portion of the third electrode overlaps with a second portion of the second gate electrode,
wherein at least the first gate electrode and the first semiconductor layer are comprised in a first thin film transistor,
wherein at least the second gate electrode and the second semiconductor layer are comprised in a second thin film transistor,
wherein the first thin film transistor and the second thin film transistor are n-channel thin film transistors,
wherein each of the first semiconductor layer and the second semiconductor layer comprises crystals each including oxygen atoms and metal atoms including In, Zn and Sn,
wherein each of the crystals has c-axis alignment,
wherein each of the crystals is a non-single-crystal including at least one of a triangular atomic arrangement and a hexagonal atomic arrangement when seen from a direction perpendicular to an a-b plane of the each of the crystals,
wherein each of the crystals comprises a layer including the Sn,
wherein an area of the first portion of the first electrode which overlaps with the portion of the first gate electrode is larger than an area of the second portion of the first electrode which overlaps with the first portion of the second gate electrode,
wherein the area of the second portion of the first electrode which overlaps with the first portion of the second gate electrode is substantially the same as an area of the portion of the third electrode which overlaps with the second portion of the second gate electrode,
wherein the second electrode is electrically connected to a first line that a first constant potential is applied,
wherein the third electrode is electrically connected to a second line that a second constant potential is applied,
wherein the first constant potential is higher than the second constant potential,
wherein a part of the second electrode is configured to function as a drain electrode of the first thin film transistor, and
wherein the area of the first portion of the first electrode is configured to function as a source electrode of the first thin film transistor.

2. The semiconductor device according to claim 1, wherein the first portion of the first electrode, the portion of the first gate electrode and the first insulating layer therebetween are configured to function as a capacitor.

3. The semiconductor device according to claim 2, wherein the first thin film transistor, the second thin film transistor and the capacitor are comprised in a bootstrap inverter circuit.

4. A semiconductor device comprising:
a first gate electrode over a substrate;
a second gate electrode over the substrate;
a first insulating layer over the first gate electrode and the second gate electrode;
a first semiconductor layer over the first insulating layer, the first semiconductor layer overlapping with the first gate electrode;
a second semiconductor layer over the first insulating layer, the second semiconductor layer overlapping with the second gate electrode;
a first electrode over the first semiconductor layer and the second semiconductor layer, the first electrode being electrically connected to the first semiconductor layer and the second semiconductor layer;
a second electrode over the first semiconductor layer, the second electrode being electrically connected to the first semiconductor layer;
a third electrode over the second semiconductor layer, the third electrode being electrically connected to the second semiconductor layer; and
a second insulating layer over the first electrode, the second electrode and the third electrode,
wherein a first portion of the first electrode overlaps with a portion of the first gate electrode,
wherein a second portion of the first electrode overlaps with a first portion of the second gate electrode,
wherein the second electrode does not overlap with the first gate electrode,
wherein a portion of the third electrode overlaps with a second portion of the second gate electrode,
wherein at least the first gate electrode and the first semiconductor layer are comprised in a first thin film transistor,
wherein at least the second gate electrode and the second semiconductor layer are comprised in a second thin film transistor,
wherein the first thin film transistor and the second thin film transistor are n-channel thin film transistors,
wherein each of the first semiconductor layer and the second semiconductor layer comprises crystals each including oxygen atoms and metal atoms including In, Zn and Sn,
wherein each of the crystals has c-axis alignment,
wherein each of the crystals is a non-single-crystal including at least one of a triangular atomic arrangement and a hexagonal atomic arrangement when seen from a direction perpendicular to an a-b plane of the each of the crystals,
wherein each of the crystals comprises a layer including the Sn,
wherein an area of the first portion of the first electrode which overlaps with the portion of the first gate electrode is larger than an area of the second portion of the first electrode which overlaps with the first portion of the second gate electrode,
wherein the area of the second portion of the first electrode which overlaps with the first portion of the second gate electrode is substantially the same as an area of the portion of the third electrode which overlaps with the second portion of the second gate electrode,
wherein the second electrode is electrically connected to a first line that a first constant potential is applied,
wherein the third electrode is electrically connected to a second line that a second constant potential is applied,
wherein the first constant potential is higher than the second constant potential,
wherein a part of the second electrode is configured to function as a drain electrode of the first thin film transistor, and
wherein the area of the first portion of the first electrode is configured to function as a source electrode of the first thin film transistor.

5. The semiconductor device according to claim 4,
wherein the first portion of the first electrode, the portion of the first gate electrode and the first insulating layer therebetween are configured to function as a capacitor.

6. The semiconductor device according to claim 5,
wherein the first thin film transistor, the second thin film transistor and the capacitor are comprised in a bootstrap inverter circuit.

7. A semiconductor device comprising:
a first gate electrode over a substrate;
a second gate electrode over the substrate;
a first insulating layer over the first gate electrode and the second gate electrode;
a first semiconductor layer over the first insulating layer, the first semiconductor layer overlapping with the first gate electrode;
a second semiconductor layer over the first insulating layer, the second semiconductor layer overlapping with the second gate electrode;
a first electrode over the first semiconductor layer and the second semiconductor layer, the first electrode being electrically connected to the first semiconductor layer and the second semiconductor layer;
a second electrode over the first semiconductor layer, the second electrode being electrically connected to the first semiconductor layer;
a third electrode over the second semiconductor layer, the third electrode being electrically connected to the second semiconductor layer; and
a second insulating layer over the first electrode, the second electrode and the third electrode,
wherein a first portion of the first electrode overlaps with a portion of the first gate electrode,
wherein a second portion of the first electrode overlaps with a first portion of the second gate electrode,
wherein the second electrode does not overlap with the first gate electrode,
wherein a portion of the third electrode overlaps with a second portion of the second gate electrode,
wherein each of the first semiconductor layer and the second semiconductor layer comprises crystals each including oxygen atoms and metal atoms including In, Zn and Sn,
wherein each of the crystals has c-axis alignment,
wherein each of the crystals is a non-single-crystal including at least one of a triangular atomic arrangement and a hexagonal atomic arrangement when seen from a direction perpendicular to an a-b plane of the each of the crystals, and
wherein each of the crystals comprises a layer including the Sn.

8. The semiconductor device according to claim 7,
wherein an area of the first portion of the first electrode which overlaps with the portion of the first gate electrode is larger than an area of the second portion of the first electrode which overlaps with the first portion of the second gate electrode.

9. The semiconductor device according to claim 7,
wherein the first portion of the first electrode, the portion of the first gate electrode and the first insulating layer therebetween are configured to function as a capacitor.

10. The semiconductor device according to claim 9,
wherein at least the first gate electrode and the first semiconductor layer are comprised in a first transistor,
wherein at least the second gate electrode and the second semiconductor layer are comprised in a second transistor, and
wherein the first transistor, the second transistor and the capacitor are comprised in a bootstrap inverter circuit.

11. The semiconductor device according to claim 10,
wherein the first transistor and the second transistor are n-channel transistors.

* * * * *

UNITED STATES PATENT AND TRADEMARK OFFICE
CERTIFICATE OF CORRECTION

PATENT NO. : 9,466,618 B2
APPLICATION NO. : 13/468580
DATED : October 11, 2016
INVENTOR(S) : Hiroyuki Miyake Page 1 of 1

It is certified that error appears in the above-identified patent and that said Letters Patent is hereby corrected as shown below:

In the Specification

Column 1, Line 59; Change "fowl" to --form--.

Column 4, Line 56; Change "305" to --303--.

Column 6, Line 22; Change "nm Preferably," to --nm. Preferably,--.

Column 9, Line 65; Change "density, N" to --density N--.

Column 10, Line 8; Change "$cm^2Vs.$" to --$cm^2/Vs.$--.

Column 10, Line 32; Change "farmed" to --formed--.

Column 12, Line 50; Change "voltage." to --voltage--.

Column 13, Line 8; Change "mariner" to --manner--.

Column 15, Line 58; Change "$(ImSnZn_3O_8)$" to --$(In_2SnZn_3O_8)$--.

Column 16, Line 25; Change "fanned" to --formed--.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*